United States Patent
Kasperkovitz et al.

[11] Patent Number: 5,809,407
[45] Date of Patent: Sep. 15, 1998

[54] RECEIVER, AN ARRANGEMENT AND A METHOD FOR COMPARING TWO SIGNALS

[75] Inventors: Wolfdietrich G. Kasperkovitz; Cicero S. Vaucher, both of Eindhoven, Netherlands

[73] Assignee: U.S. Philips Corporation, New York, N.Y.

[21] Appl. No.: 762,681

[22] Filed: Dec. 11, 1996

[30] Foreign Application Priority Data

Dec. 21, 1995 [EP] European Pat. Off. .............. 95203594

[51] Int. Cl.[6] ...................................................... H04B 1/18
[52] U.S. Cl. .................................... 455/184.1; 455/161.3; 455/174.1; 455/181.1; 455/194.1; 455/226.2; 455/218; 375/317; 348/180; 348/731
[58] Field of Search .............................. 455/184.1, 185.1, 455/181.1, 182.1, 174.1, 171.1, 161.3, 161.1, 161.2, 150.1, 190.1, 192.1–192.3, 194.1, 195.1–196.1, 212, 218, 221, 255, 313, 226.1–226.2; 375/317, 316, 319, 344, 345; 324/76.12, 76.13; 364/487; 348/180, 731, 733

[56] References Cited

U.S. PATENT DOCUMENTS

4,069,455  1/1978  Sherman, Jr. ........................ 455/150.1
5,027,431  6/1991  Tanaka et al. ........................ 455/161.3

FOREIGN PATENT DOCUMENTS

4316687A1  11/1994  Germany .

*Primary Examiner*—Nguyen Vo
*Assistant Examiner*—Doris To
*Attorney, Agent, or Firm*—Edward W. Goodman

[57] ABSTRACT

A receiver, an arrangement and a method for comparing two signals, based on testing whether a first signal exhibits at least one property during a first time interval, and consecutively testing if a second signal exhibits at least one similar property during a second time interval, following the first time interval, the second time interval being in the range of 200 us to 5 ms. The assumption is made that if a first signal exhibits a certain property during a first time interval, it is likely to exhibit substantially the same property during a second time interval, following the first interval. Thus, if a second signal exhibits such a property during the second time interval, the second signal is deemed to be the same as the first signal. If both tests are positive, the two signals are determined to be the same. In this way, both signals need not be present simultaneously. By choosing the second interval in the range as given above, no extremely fast tuning system is needed, without the comparison becoming annoyingly audible.

8 Claims, 4 Drawing Sheets

5,809,407

RECEIVER, AN ARRANGEMENT AND A METHOD FOR COMPARING TWO SIGNALS

BACKGROUND OF THE INVENTION

1. Field of the Invention

The invention relates to a receiver comprising:

tunable receiving means for receiving and demodulating an RF signal, comprising an output for supplying an output signal, tuning means coupled to the tunable receiving means for tuning the tunable receiving means, evaluating means coupled to the output of the tunable receiving means for evaluating a property of the output signal.

The invention also relates to an arrangement for comparing a first signal and a second signal, comprising:

evaluating means for evaluating sequentially at least a fragment of the first signal and at least a fragment of the second signal, determining means for determining on the basis of the evaluation if the first and second signals are the same.

The invention further relates to a method for comparing a first signal with a second signal, comprising the steps of:

evaluating sequentially at least a fragment of the first audio signal and at least a fragment of the second audio signal, determining on the basis of the evaluation if the audio signals are the same.

2. Description of the Related Art

Such a receiver and method are known from DE 43 16 687 A1. The receiver described herein uses only a single tuner for comparing two signals. In the receiver, a fragment, or in this case a sample, is taken from the first audio signal and a sample is also taken from the second audio signal at a different time. In the evaluation, the two samples are compared with each other and if they deviate less than a predetermined amount from each other, an output signal is generated, indicating that the two signals are the same. As the samples are taken at different moments in time, this can be done in a receiver with a single tuner by quickly tuning the receiver from one frequency to another for reception of first the first audio signal and then the second audio signal. However, a drawback is that for the comparison, at least one of the samples needs to be stored. This results in a more complex receiver as storage means are needed for storing at least one of the samples.

SUMMARY OF THE INVENTION

An object of the invention is to provide a receiver as described in the opening paragraph, wherein no storage of fragments is needed, and a corresponding arrangement and method.

A receiver according to the invention is characterized in that the receiver further comprises control means coupled to the tuning means and to the comparing means, said control means being arranged for carrying out a sequence of:

tuning the tunable receiving means to a first frequency, testing if the output signal exhibits at least one property in a first time interval, tuning the tunable receiving means to a second frequency, testing if the output signal exhibits at least one similar property in a second time interval, following the first time interval, said second time interval having a duration substantially in the range of 200 microseconds to 5 milliseconds, determining the output signals to be the same if both tests are positive.

The present invention is based on the recognition that a property of an audio signal can last over a relatively long time. Thus, if it is established that a signal exhibits a certain property over a first time interval, there is a high probability that the signal will still exhibit substantially the same property over a second time interval, following the first time interval. Thus, according to the invention, by checking during a first time interval if the output signal exhibits at least one property (when tuned to a first RF signal on the first frequency), and then checking if the output signal exhibits at least one similar property during the second time interval when the receiver is tuned to a second frequency for reception of a second RF signal, it can be determined if the two output signals (and thus the programs of the two RF signals) are the same. By checking the individual output signals each on a property, no direct comparison of the signals with each other is needed. This eliminates the need for storing a fragment or sample of one of the signals. By choosing the second time interval in the range of 200 microseconds to 5 milliseconds, this interval is long enough to determine with sufficient accuracy the at least one (similar) property, whereas due to the limited length of the second interval, the interruption of the output signal of the first RF signal is not long enough to cause serious audible artifacts.

An embodiment according to the invention is characterized in that the control means are further arranged for:

tuning the tunable receiver means to the first frequency, testing if the output signal exhibits at least one similar property in a third time interval, following the second interval, determining the output signals to be the same based on an evaluation of the three tests.

It is possible that during the second time interval, the properties of the output signal received at the first frequency changes, and if the output signal received at the second frequency is equal to the output signal at the first frequency, the properties of the output signal at the second frequency will change automatically as well. If the sequence of steps only involves two time intervals, a result would be that in this situation the two output signals would be judged to be different, although they are actually the same. By including a check on the output signal at the first frequency during a third interval, following the second interval, it can be determined if the properties of the output signal at the first frequency have changed during the second time interval. This is indicated by a different result of the test during the third interval as compared to the first interval. Now it is possible to increase the reliability of the algorithm for example, by discarding the result of the tests if the result of the first and third tests are different.

An embodiment according to the invention is characterized in that a property of the signal is that the signal is below a first threshold. A useful property, which is sufficiently characteristic for an output signal, is the occurrence of a relatively silent part in the signal, which is detected when the audio signal remains below a threshold for a certain duration. Such a relatively silent part can last for a significant amount of time, exceeding the combined length of the first and second time intervals. The chances of a relatively silent part occurring in the output signal when tuned at the first frequency during the first time interval coinciding with a relatively silent part in a different output signal when tuned to the second frequency during the second time interval, are sufficiently small to make a determination on signal equality, based on the detection of relatively silent parts in the signals, reliable enough for practical use. This is especially advantageous for use in a single-tuner receiver. As, during the second interval, the receiver is tuned for reception of the second signal, the output to the audio processing stages needs to be suppressed. As this suppression takes place during a relatively silent part of the signal, this will be practically inaudible.

An embodiment according to the invention is characterized in that a property of the signal is that the signal is above a second threshold. Another useful property is the occurrence of a relatively loud part in the signal, which is detected if the signal is above a threshold during the time interval. Such occurrences are characteristic for a signal in a similar way as relatively silent parts, and a detection and determination on signal equality will be sufficiently reliable as well.

An embodiment according to the invention is characterized in that the threshold involved is adapted to the output signal when tuned to the first frequency. It is possible that by a combination of a relatively high threshold and a very soft output signal (or vice versa) during the first interval, that the first test does not give a positive result during a considerable time interval. Especially regarding the test in the first interval, this might result in a situation wherein no further tests are executed because the first test is a necessary condition for the second (and possibly the third) test. By adapting the threshold to the output signal in the first interval, especially for the test in the first interval, such a long waiting time to get results can be avoided.

An embodiment according to the invention is characterized in that the control means are arranged for repeating the sequence of tuning and testing n times, and in that the output signals are determined to be the same if in at least m out of n times the conditions involved are met. The reliability of the method can be improved upon by not relying on a single evaluation, but by taking a number of sequences, out of which a minimum number should give a positive result.

An embodiment according to the invention is characterized in that the control means are arranged for waiting a predetermined period between each sequence. It is possible that the output signal at one of the two received frequencies exhibits a property over a very long time. When the other signal has a similar property only during—but not outside—the second interval, this may lead to the result that the two signals are determined to be the same, even if they are not. By inserting a waiting period, the chances of a signal having a property over a long time, being judged the same as a signal having such a property (or a similar property) only over short times, is considerably reduced. A further advantage is that if, during the second time interval, the signal going to an electroacoustical transducer needs to be muted, such a muting action will become less audible if it is not repeated too often.

An embodiment according to the invention is characterized in that the control means are arranged for executing a further sequence, substantially equal to the sequence, but differing in that the at least one property and similar properties in the sequence are different from the at least one property and the similar properties in the further sequence. According to the invention, a further sequence of steps is added to the evaluation. This further sequence of steps involves testing on a property differing from the property, tested in the first sequence of steps. By not relying on just one property, but on another property as well, the reliability of the method is improved. For example, the property in the first sequence may be the signal being below a first threshold and the property in the further sequence may be the signal being above a second threshold, or vice versa.

An arrangement according to the invention is characterized in that the determining means are arranged for:
testing if the first signal exhibits at least one property in a first time interval,
testing if the second signal exhibits at least one similar property in a second time interval, following the first time interval, said second time interval having a duration substantially in the range of 200 microseconds to 5 milliseconds,
determining the first and second signals to be the same if both tests are positive.

Such an arrangement can be used advantageously, separate from a receiver, for comparing two signals.

A method according to the invention is characterized in that the evaluation comprises a sequence of steps of:
testing if a first condition is true, said first condition indicating if in a first time interval the first signal exhibits at least one property,
testing if a second condition is true, said second condition indicating if in a second time interval, following the first time interval, the second signal exhibits at least one similar property, said second interval having a duration substantially in the range of 200 microseconds to 5 milliseconds,
and in that the audio signals are determined to be the same if both conditions are true. The method according to the invention can be employed advantageously in a receiver, as only a single tuning system is need, due to the sequential nature of the tests.

BRIEF DESCRIPTION OF THE DRAWINGS

The above object and features of the present invention will be more apparent from the following description of the preferred embodiments with reference to the drawings, wherein.

In the flow diagrams, a "Y" means that a condition in the block is met, and an "N" means that the condition is not met.

DESCRIPTION OF THE PREFERRED EMBODIMENTS

Figure 1:
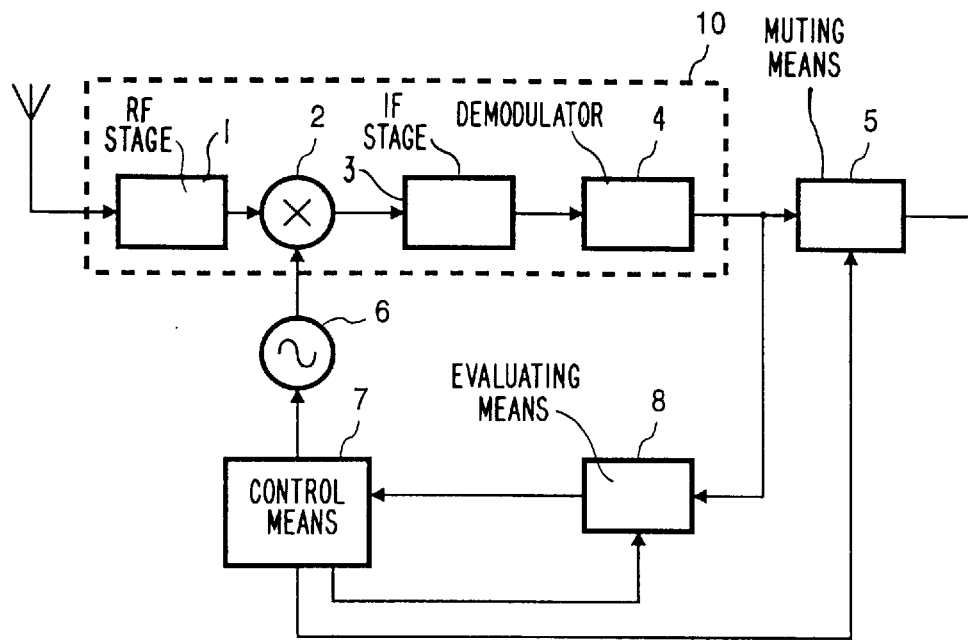
FIG. 1 shows an embodiment of a receiver according to the invention.

FIG. 1 shows an embodiment of a receiver according to the invention. In the receiver, an RF stage 1 receives an RF signal and a mixer stage 2 is coupled to an output of the RF stage 1 for mixing the RF signal with a signal from a local oscillator 6. Thus, the RF signal is down-converted into an IF signal. An IF stage 3 is coupled to an output of the mixer stage 2 for selecting the IF signal. A demodulator 4 is coupled to an output of the IF stage 3 for demodulating the selected IF signal, and a muting stage 5 is coupled to an output of the demodulator 4. Thus elements 1 to 4 constitute the tunable receiving means 10. The output of the demodulator 4 is thus the output of the tunable receiving means 10. The receiver further comprises control means 7, coupled to the tuning means 6, in this case, the local oscillator or programmable synthesizer, for controlling a tuning frequency of the tunable receiving means 10. Said control means 7 is also coupled to the muting stage 5 for supplying a muting signal to the muting stage 5 for muting the audio signal on command of the control means 7. The receiver, according to the invention, further comprises evaluating means 8 being coupled to the output of the demodulator 4 and to the control means 7 for comparing the audio signal with a reference which is supplied by the control means 7. The evaluating means 8 delivers an output signal indicating if the audio signal is greater or smaller than the reference, this output signal being supplied to the control means 7 for evaluating the output signal. The receiver, according to the invention, is able to compare two programs on different frequencies and to judge whether or not the programs are the same.

The operation of the receiver according to the invention is as follows. The receiver is tuned to a first frequency F1 for receiving a first program P1. This is done using the control means 7, which supplies the local oscillator 6 with proper frequency information. If the control means 7 detects that the evaluating means 8 indicates that during a time interval T1 the audio signal from the demodulator 4 stays below a first threshold Thr1, the control means 7 supplies the local oscillator 6 with frequency information for tuning the receiver to a second frequency F2 for reception of a program P2. At the same time the control means 7 generates a muting control signal to mute the audio signal going to further processing stages in the receiver (not shown). When, during a second time interval T2, the control means 7 detects that the output signal of the evaluating means 8 signals that the audio signal (now coming from program P2 instead of program P1) is below a second threshold Thr2, the control means 7 sets a flag indicating that according to this check, the programs P1 and P2 are judged to be the same. With the terms "setting a flag" is also understood the following: supplying a signal indicating that the two signals are the same. If the audio signal remains above the second threshold, the control means 7 does not set the flag. After elapsing of time interval T2, the control means 7 tunes the receiver again to the first frequency F1 and then releases the muting control signal. In short, the control means 7 waits until a relatively silent part having a sufficient duration is present in the first program, and if so, checks if such a relatively silent part is also present in the second program for certain duration. If this is the case, the programs are considered to be the same. This decision is based on the assumption that a relatively silent part in a program, having a first duration T1, is likely to continue for a second time interval T2 as well. Of course, it is not necessary for the control means 7 to set a flag, but this is used as an illustration that, when a flag is set, a condition has been met, this condition being the consecutive occurrence of a relatively silent part in programs P1 and P2. In this way two programs can be compared, using only a single tuning system. A further advantage is that no measurement of the complete duration of a silent part in a program is necessary, as the present invention is based on the assumption that, a demodulated signal from a different frequency carrying the same program (=alternative frequency) should display the same time pattern (envelope) or properties as the demodulated signal from the original frequency. That means that, according to the invention, upon detection of a certain property, in this case, the occurrence of a relatively silent part in the audio signal, a similar relatively silent part in the program on a true alternative frequency is expected to be present as well, i.e., on an alternative frequency carrying the same program.

If this is not the case, the program on the alternative frequency is probably not the same program as the program on the original (first) frequency, and instead a pirate or some other local station is received. A relatively silent part in a program in the sense as used above, denotes pauses as well as local minima in music or speech.

In the algorithm described above, the control means 7 detects that the audio signal is below a certain threshold. This is only one possible property. According to the invention, it is also possible to reverse this condition: detect large signal excursions, meaning that it is detected if during said time intervals the respective audio signals are above the respective thresholds. This does not affect the operation of the receiver and may also give reliable results. Furthermore, it is also possible to use other properties of the signals to compare two signals.

During the tuning of the receiver from frequency F1 to F2 and back, and the time interval T2 therein between, the audio signal to further processing stages is muted. If this muting takes too long, this may result in an audible gap in the audio signal. However, listening tests have shown that a gap of 5 milliseconds or shorter is considered to be hardly annoying, when not repeated too often. For example, a muting time of 4 milliseconds, together with a tuning speed of 1 millisecond (=the time needed for tuning the receiver from one frequency to another frequency), results in a length of 2 milliseconds for the time interval T2, which is sufficient for practical purposes. If the tuning takes less than 1 millisecond, the time interval T2 can be stretched, accordingly. An advantage of checking on relatively silent parts in a program is that a muting action in a relatively silent part of the program will hardly be audible, if at all. With a minimum length of approximately 200 microseconds, it is possible to determine, with sufficient accuracy, if the signal exhibits the required property.

The length of time interval T1, during which a check take place, may be chosen at will, as the audio signal need not be muted during this check. In practice, a value of 20 milliseconds for T1 has been found acceptable, although other values are possible.

For threshold Thr1, a value of 4% of the maximum allowed signal level was found to be acceptable in the case of checking relatively silent parts, and a value of 12% (or 3*Thr1) in the case of checking relatively loud parts. Threshold Thr2 can be chosen equal to Thr1, but in the case of relatively silent parts, a value of 1.25*Thr1 was found satisfactory (Thr5=Thr4/3 in the case of checks on relatively loud parts). It is possible that during T2, the audio signal of a program may start to deviate from the values it had during T1. This may lead to the conclusion that two programs judged not to be the same, even if they are. By choosing Thr2 somewhat larger (or smaller) for checks of relatively silent (or loud) parts, the chances on such a wrong conclusion are reduced.

Figure 2:
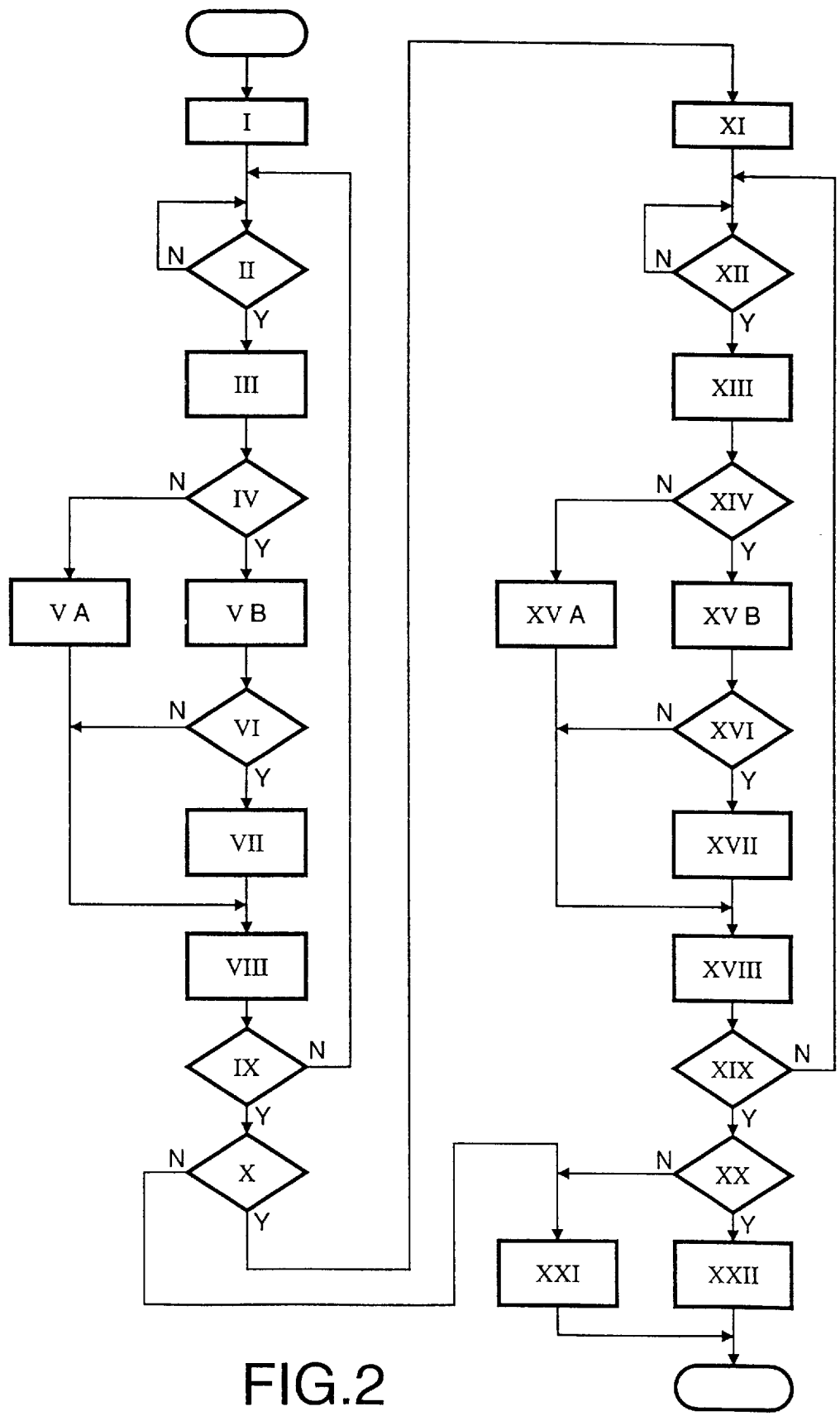
FIG. 2 shows a flow diagram of a first algorithm according to the invention.

FIG. 2 shows a flow diagram of a first algorithm according to the invention. This algorithm is more elaborate than the one described in conjunction with the receiver of FIG. 1.

TABLE 1

Description of the blocks in FIG. 2.

| Block number | Description |
| --- | --- |
| I | i=0, r=0 |
| II | Audio signal < Thr1, during T1? |
| III | Tune to frequency F2 and activate mute |
| IV | Audio signal < Thr2, during T2? |
| VA | Tune to frequency F1 and release mute |
| VB | Tune to frequency F1 and release mute |
| VI | Audio signal < Thr3, during T3? |
| VII | r=r+1 |
| VIII | i=i+1 |
| IX | i=n? |
| X | r≥m? |
| XI | i=0, r=0 |
| XII | Audio signal > Thr4, during T4? |
| XIII | Tune to frequency F2 and activate mute |
| XIV | Audio signal > Thr5, during T5? |
| XVA | Tune to frequency F1 and release mute |
| XVB | Tune to frequency F1 and release mute |
| XVI | Audio signal > Thr6, during T6? |
| XVII | r=r+1 |
| XVIII | i=i+1 |
| XIX | i=p? |
| XX | r≥q? |
| XXI | Programs on F1 and F2 are different |
| XXII | Programs on F1 and F2 are the same. |

This algorithm comprises both a sequence of checks on relatively silent parts in the programs, and a sequence of checks on relatively loud parts in the programs. First a first series of checks on relatively silent parts is executed. If these checks give a negative result, the programs are considered to be different and no further checks are necessary. If these checks give a positive result (i.e., according to these checks the programs are the same), a second series of checks on relatively loud parts is executed as an extra confirmation. If these last checks also give a positive result, then the two programs are considered to be the same, whereas if these last checks give a negative result, the result of the first series of checks is discarded. By including an extra series of checks as confirmation, the reliability of the algorithm is improved. An algorithm comprising only checks on relatively silent parts in programs has the risk that two different programs, each containing lots of relatively silent parts, such as speech programs, may be judged the same. This is avoided by including checks on large signal excursions or relatively loud parts in the programs. The likelihood that both series of checks will result in a wrong conclusion is much smaller than the likelihood that a wrong conclusion is drawn, based on only checks on relatively silent parts. Of course, it is possible to reverse the order of checks, but a drawback of this is that now the less inaudible checks on relatively loud parts are performed always and the practically inaudible checks on relatively silent parts are skipped when the checks on relatively loud parts give a negative result.

Now the algorithm of FIG. 2 will be described in more detail. At the start of the algorithm, the receiver is tuned to the first frequency F1 for receiving the first program P1. In block I, several counters are reset to zero, namely a counter i for counting the number of checks already performed and a check counter r for counting the number of positive checks. In block II, the audio signal of the received program is compared with a threshold Thr1 during a first time interval T1. If the audio signal is smaller than Thr1 during T1, then, in block III, the mute is activated and the receiver is tuned to a second frequency F2 for receiving program P2. After tuning to frequency F2, the audio signal of the received program—now program P2—is compared to a second threshold Thr2 during a time interval T2 in block IV. Independent of the outcome of the check in block IV, the receiver is again tuned to frequency F1 for receiving program P1 and the mute is released in blocks VA and VB. If the audio signal is smaller than the threshold Thr2 during T2 (block IV), then, in block VI, a further comparison is made of the audio signal—now from program P1 again—with a third threshold Thr3 during a time interval T3. If the audio signal is smaller than Thr3, the result of the sequence of checks on relatively silent parts is positive and the check counter r is raised by 1 in block VII. In block VII, counter i is raised by 1 as well. In block IX, the value of counter i is compared with n, which is the maximum number of checks on relatively silent parts. If the value of i equals n, then enough checks have been performed and the algorithm continues with block X. If not, then the algorithm returns to block II to perform another check. If, in block VI, the audio signal is not smaller than threshold Thr3 during time interval T3, the check is negative (no relatively silent part of duration T2 being present in program P2) and the algorithm goes to block VIII without raising the check counter r. If, in block IV, the audio signal is not smaller than threshold Thr2 during time interval T2, then the check is also negative and the algorithm again goes to block VIII (after tuning the receiver to frequency F1 and releasing the mute in block VA) and thus skips a further check on program P1 in block V1. In block X, if the number of positive checks r is smaller than m, denoting the minimum required number of positive checks, the algorithm goes directly to block XXI which block indicates that the audio signals in frequencies F1 and F2 are not the same and, consequently, programs P1 and P2 are judged to be different from each other.

If r equals or exceeds m, then a second series of checks on relatively loud parts is performed, similar to the first series of checks on relatively silent parts. In block XI, counters i and r are reset to zero. In block XII, the audio signal—from program P1 again—is compared with a fourth threshold Thr4 during a time interval T4. If the audio signal is larger than Thr4, then, in block XIII, the mute is activated and the receiver is tuned to frequency F2 for receiving program P2. Now, in block XIV, the audio signal—now from program P2—is compared with a fifth threshold Thr5 during a time interval T5. Independent of the outcome of this check, the receiver is tuned to frequency F1 for receiving program P1 and the mute is released in blocks XVA and XVB. If, in block XIV, the audio signal was larger than Thr5 during T5, the audio signal—from program P1 again—is compared in block XVI with a sixth threshold Thr6 during a time interval T6. If the audio signal is larger than Thr6, then, in block XVII, the counter r is raised one, as the check is positive. If, in blocks XIV or XVI, the respective audio signal is smaller than the respective threshold, the check is negative and the algorithm goes to block XVIII, without raising the counter r. In block XVIII, counter i, counting the number of checks already performed, is raised by 1 as well. In block XIX, it is decided whether or not enough checks on relatively loud parts have been performed. If i is not equal to p, the maximum number of checks, not enough checks have been performed and the algorithm returns to block XII to perform another check. If i is equal to p, then in block XX, the number of positive checks r is compared with q, the minimum number of positive checks on relatively loud parts. If r is equal to or greater than q, then result of the series of checks is positive and the algorithm goes to block XXII, which indicates that both programs are judged to be the same. If not, then the result is negative and the algorithm goes to block XXI.

Compared to the algorithm as used in the receiver of FIG. 1, in the algorithm of FIG. 2, the check involves a further check of program P1 during a third time interval T3 (block VI in the first series of checks, block XVI in the second series of checks). A drawback of using only two checks (blocks II and IV) is that it is possible for a relatively silent (or loud) part to end during time interval T2 (T5). The algorithm would then decide that the check is negative, although the two programs may be identical. This false result can be avoided by including a third check during time interval T3 (T6) in program P1, as this means that the audio signal should have remained substantially the same in program P1 after the check in program P2. A result of this is that now the minimum length of the relatively silent (loud) part should be at least T1+T2+T3, instead of T1+T2.

An improvement of the algorithm of FIG. 2 over the algorithm as described in conjunction with FIG. 1, is that a decision on program equality is now based not on just one measurement, but on a series of measurements. In the algorithm of FIG. 2, a statistical evaluation is made by performing n checks on relatively silent parts, out of which number n, at least m checks should be positive. In this manner the reliability is further increased. The number n may be chosen at will. Values ranging from 5 to 20 have been tried with positive results, but more checks are also possible, although a too large number will result in a slow algorithm. A similar statistical evaluation is made by performing p sequences of checks on relatively loud parts, out of which at least q sequences should be positive. This is done again to improve the reliability of the algorithm.

During blocks III . . . V and blocks XIII . . . XV, the audio signal from the demodulator is suppressed in the muting stage 5 of the receiver. Suppression during a check on a relatively silent part is inherently hardly audible. Suppression during a check on a relatively loud part may be audible. To avoid the latter suppression from becoming annoyingly audible, a waiting period between each sequence of checks can be inserted. A waiting period of 0.5 seconds or more should be adequate. Such a waiting period may also be inserted between checks in the first series, not so much for reasons of audibility, but more for reasons of reliability. Namely, this will avoid a comparison of a very long relatively silent part in program P1 with a number of short relatively silent parts in program P2, which would result in a positive but erroneous check.

As the checks during time intervals T3 and T6—just like the checks during time intervals T1 and T4—take place when the receiver is tuned to the first frequency F1, these intervals may have arbitrary lengths as no suppression takes place and these checks can not be heard. A value of approx. 5 milliseconds has been found acceptable for both T3 and T6, although these values may be chosen different and at will.

It may happen that the audio signal of program P1 does not stay long enough (if at all) below the threshold Thr1. This would mean that no checks would be performed at all. This can be avoided in several ways. One way is to make threshold Thr1 proportional to the average power or the peak level of the audio signal of program P1 (not shown). Other thresholds may then be made proportional as well, although this is not necessary. Another way is to increase threshold Thr1, when, after a certain time, no relatively silent part of duration T1 was detected. This can be repeated until finally a such a silent part is detected. A similar approach can be made for the check in block XII, where the threshold may be lowered if after a certain time the audio signal did not stay long enough greater than Thr4. In the flow diagram of FIG. 2, the algorithm just returns to the start of block II (or XII) and waits until a first check is positive (i.e., the condition in block II or XII is met). In the feedback path from the No-condition in block II (or XII) to the start of the block, steps may be included to adjust the respective thresholds Thr1 (or Thr4) in the manner described, if desired.

The checks in blocks II, IV and VI may be any of the following examples:

during the complete time interval the audio signal should be below the respective threshold, during a percentage of the time interval the audio signal should be below the threshold, an average value of the audio signal in the time interval should be below the threshold, etc.

The checks in block XII, XIV and XVI may be similar to the checks as given above. However, the check in block XII (and possibly in block XVI as well) may also include the condition that the algorithm only goes to the next block when the audio signal exceeds the threshold. This mean that as soon as the condition is met, the algorithm goes to the next block, without any waiting until a predetermined time period has elapsed: the time interval ends at the very moment the condition is met.

For the length of the respective time intervals and the values of the respective thresholds a wide variety of values are possible. Satisfying results have been obtained with the following values:

T1=20 milliseconds, T2=2 milliseconds, T3=5 milliseconds, T4=T1, T5=T2, T6=T3, Thr1=4% of the maximum allowed audio signal level, Thr2=1.25*Thr1, Thr3=Thr1, Thr4=3*Thr1, Thr5=Thr6=Thr1. It is of course also possible to choose Thr1=Thr2=Thr3 and Thr4=Thr5=Thr6=3*Thr1. The ratio between Thr4 and Thr1 does not need to be 3, but this has been found to be an acceptable value. The above values are only given as illustration, meaning that other values are also possible.

In FIG. 2 one possible embodiment for an algorithm according to the invention is given. Other embodiments, wherein a decision on program equality is reached based on other combinations of the checks in blocks II, IV and VI (resp. XII, XIV and XVI), are also possible. For example, the update of counters r and i, as shown in FIG. 2, can also be done in other ways. In Table 2, three examples are given of updates of counters r and i, depending on the results of the conditions in blocks II, IV and VI, wherein Example 1 corresponds to the algorithm of FIG. 2.

TABLE 2

Examples of possible updates of counters r and i.

| Conditions in Blocks: | | | Example 1 | | Example 2 | | Example 3 | |
| --- | --- | --- | --- | --- | --- | --- | --- | --- |
| II | IV | VI | r | i | r | i | r | i |
| Y | Y | Y | +1 | +1 | +1 | +1 | +1 | +1 |
| Y | Y | N | +0 | +1 | +0 | +0 | +1 | +1 |
| Y | N | Y | +0 | +1 | +0 | +1 | +0 | +1 |
| Y | N | N | +0 | +1 | +0 | +0 | +0 | +0 |

In example 1, counter r is increased only when all three conditions in blocks II, IV and VI have been met. Counter i is increased each time a sequence of checks on relatively silent parts has been stepped through. Example 1 can lead to a false result in the case of the results of blocks II and VI being different. Now a premature ending of the relatively silent part is detected, but it is not clear when exactly this has ended: was it before time interval T2 (and is the negative result of block IV due to programs P1 and P2 being different), or was it in or after time interval T2 (and is the positive result of block IV due to an accidental relatively silent part in program P2, program P2 being different from program P1), or are programs P1 and P2 actually the same?

Figure 3:
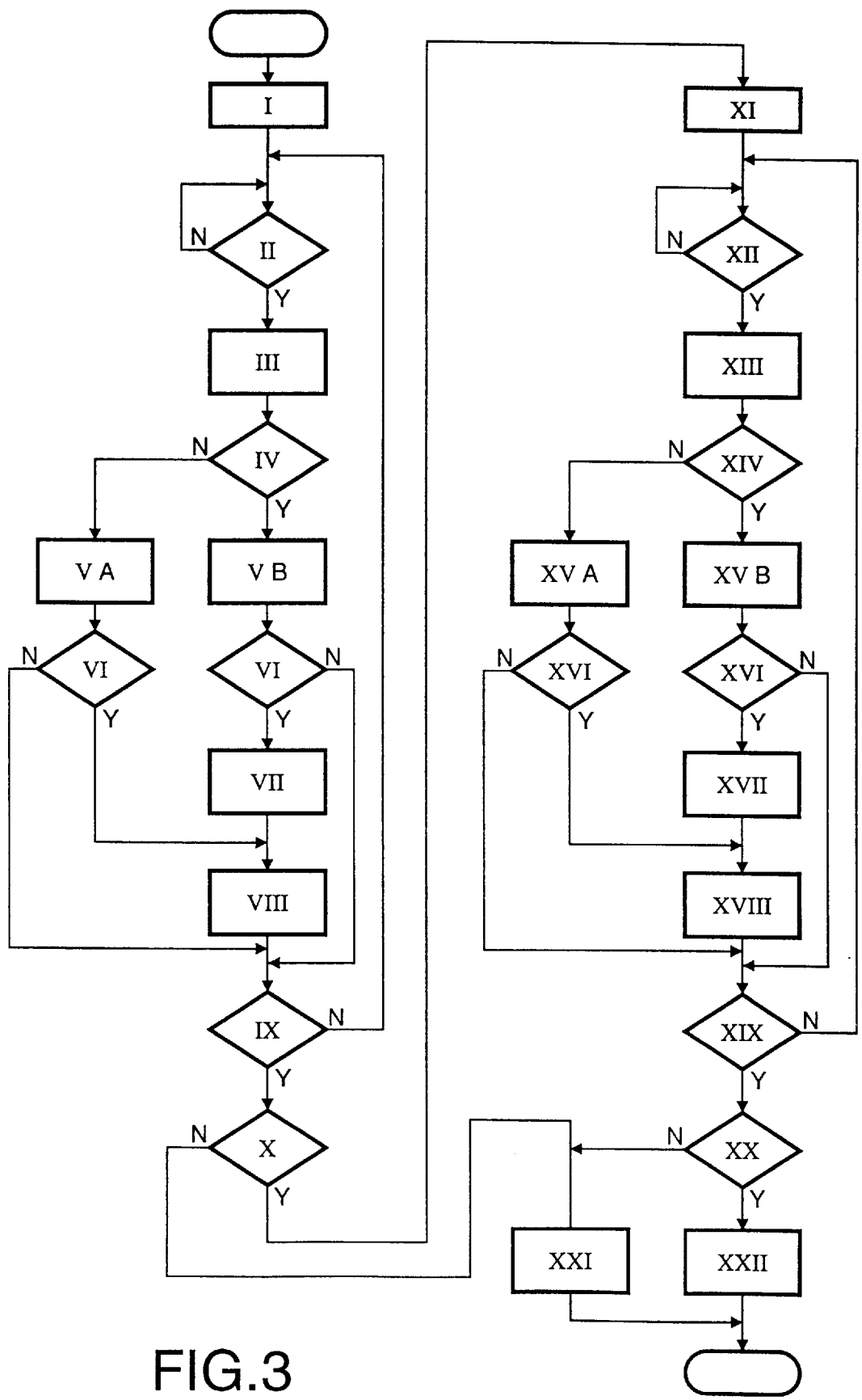
FIG. 3 shows a flow diagram of a second algorithm according to the invention.

FIG. 3 shows a flow diagram of a second algorithm according to the invention. FIG. 3 corresponds to example 2 of Table 2. FIG. 3 shows another way of dealing with the results of the checks and differs from FIG. 2 in that blocks VI, VII and VIII (and blocks XVI, XVII and XVIII) are connected differently. Now, a block VI is placed after each of the blocks VA and VB. The "No" output of the block VI, following block VA, leads to block IX, thereby not increasing both counters r and i. The "Yes" output of said block VI leads to block VIII, thus only increasing counter i but not counter r. The "No" output of the block VI, following block VB, leads to the beginning of block IX, thereby also skipping blocks VII and VIII. These changes mean that the checks, wherein the result of block II does not correspond to the result of block VI, are discarded, as it is assumed that between T1 and T3 the relatively silent part may have ended, thereby making the result of block IV unreliable.

Figure 4:
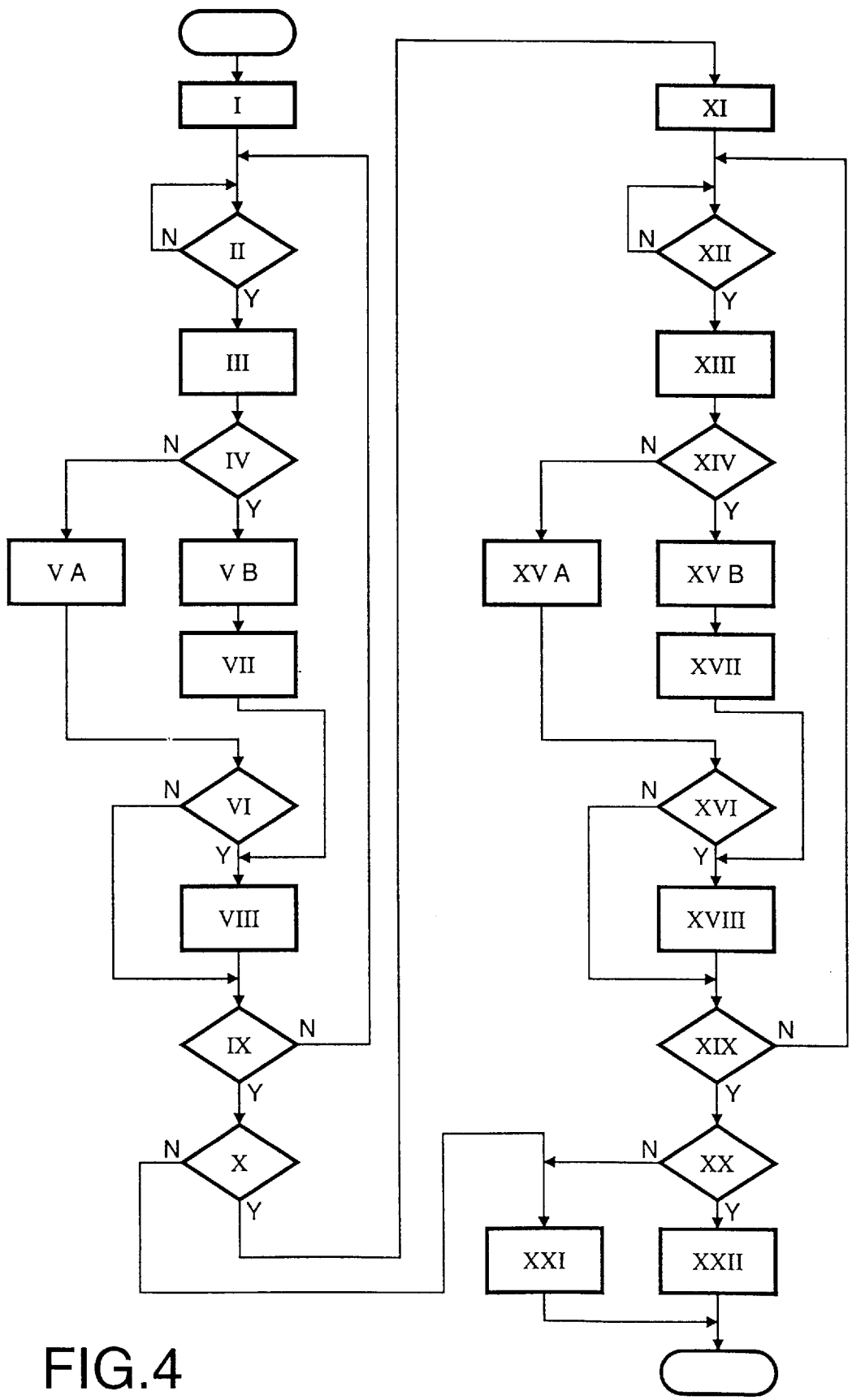
FIG. 4 shows a flow diagram of a third algorithm according to the invention.

FIG. 4 shows a flow diagram of a third algorithm according to the invention. FIG. 4 corresponds to Example 3 of Table 2. FIG. 4 differs from FIG. 3 in that the block VI following block VB is deleted and block VB is directly connected with block VII. Thus, FIG. 4 shows is a faster version of the algorithm, as when in block IV the condition is met, no further check in block VI is required and this block may then be skipped. When the result of block VI is negative and the result of block IV is negative, this negative result of block IV is assumed to be unreliable as it can be caused by either a premature ending of the relatively silent part during time interval T2 or program P2 being a different programs. To avoid taking a wrong decision, the counters are not increased, thereby discarding the result of these possibly wrong checks. Thus, in Example 3, the emphasis is put on the result of block IV, as this determines whether or not a further check is required and/or the result should be discarded. In Example 2, the emphasis is put on the result of block VI, as this determines whether or not the total check is reliable. A similar table can be constructed for the conditions in blocks XII, XIV and XVI.

The audio signal, prior to being compared to a threshold, may undergo some treatment. This may involve the removal of a pilot tone in the case of an FM demodulated stereophonic audio signal. It may also involve:

low-pass filtering for a reduction of noise or interference,
rectifying for reducing the complexity of the checks as now only one polarity is present,
low-pass filtering of the rectified signal (and even subsampling) to reduce complexity especially if the algorithm is performed in the digital domain.

During the times that the receiver is tuned to the second frequency F2, an evaluation can be made of the reception quality. Thus, a program comparison according to the invention can be combined with a quality check. Thus, the receiver is provided with information on which frequencies the same program is transmitted and what the reception quality on these frequencies is. This feature can be used for switching over to an alternative frequency when on the presently received frequency the reception quality starts to degrade. This feature can also be used advantageously together with the Alternative Frequency list provided in the RDS system. In the RDS signal, alternative frequencies of the presently received program are transmitted, but occasionally one of those alternative frequencies may be occupied by a pirate or a local station. The algorithm according to the invention provides a simple way of checking the program on the alternative frequency and thereby avoiding a switch-over to an Alternative Frequency, which happens to be occupied by a different program. Thus, the second frequency F2 is one of the frequencies provided by the Alternative Frequency list, transmitted in the RDS signal.

The algorithms shown are not limited to the use in a receiver. They can be used in general for comparing two audio signals with only a single signal comparison means. In this case, the algorithm starts with supplying the first audio signal to the evaluating means 8, the blocks III and XIII may read: "supply a second audio signal to the evaluating means 8", and the blocks VB and XVB may read: "supply the first audio signal to the evaluating means 8", and blocks VA and XVA may be deleted.

Figure 5:
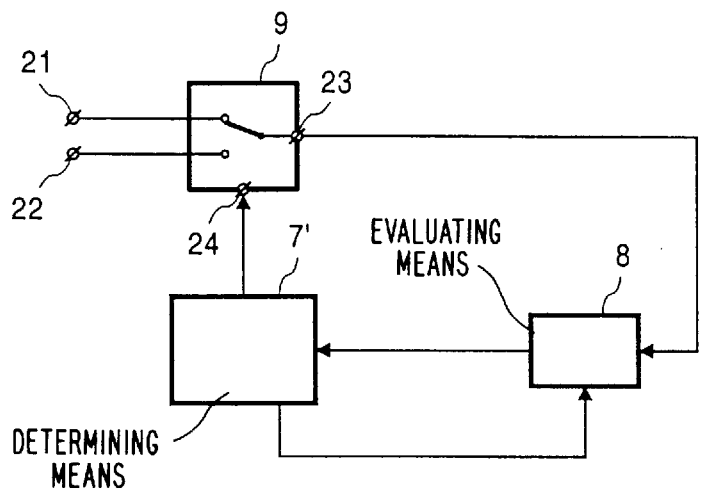
FIG. 5 shows an embodiment of an arrangement according to the invention.

FIG. 5 shows an embodiment of an arrangement according to the invention. The arrangement comprises selecting means 9, comprising first and second signal inputs 21 and 22, a signal output 23, and a selection input 24 for selecting one of the first and second inputs 21 and 22 to be coupled to the signal output 23 on command of a selection signal applied to the selection input 24. The output 23 is coupled to an input of evaluating means 8, similar to the evaluating means in FIG. 1. The output of the evaluating means 8 is coupled to determining means 7', which is in function similar to the control means 7 of FIG. 1, but differs in that it does not provide first and second tuning frequencies for selecting first and second audio signals, but now it provides a selection signal to select the first or second input 21 or 22, respectively. Determining means 7' is also coupled to the evaluating means 8 for supplying the respective references, just as in FIG. 1. The operation of the arrangement need not be explained any further, as it has been extensively dealt with in connection with FIG. 1 and the flow diagrams. FIG. 5 is only an example of such an arrangement. There are other ways for the skilled man to realize such an arrangement without deviating from the gist of the invention, for example, by implementing such an arrangement digitally or possibly in a digital signal processor. Thus, the examples given above are merely given to illustrate the present invention and are by no means intended to delimit the invention.

We claim:
1. A receiver comprising:
    tunable receiving means for receiving and demodulating an RF signal, comprising an output for supplying an output signal,
    tuning means coupled to the tunable receiving means for tuning the tunable receiving means,
    evaluating means coupled to the output of the tunable receiving means for evaluating a property of the output signal,
characterized in that the receiver further comprises control means coupled to the tuning means and to the evaluating means, said control means being arranged for carrying out a sequence of:
    tuning the tunable receiving means to a first frequency,
    testing if the output signal exhibits at least one property in a first time interval,
    tuning the tunable receiving means to a second frequency,
    testing if the output signal exhibits at least one similar property in a second time interval, following the first time interval, said second time interval having a duration substantially in the range of 200 microseconds to 5 milliseconds,
    determining the output signals to be the same if both tests are positive.

2. The receiver of claim 1, characterized in that the control means are further arranged for:

tuning the tunable receiver means to the first frequency, testing if the output signal exhibits at least one similar property in a third time interval, following the second interval, determining the output signals to be the same based on an evaluation of the three tests.

3. The receiver of claim 1, characterized in that a property of the signal is that the signal is below a first threshold.

4. The receiver of claim 1, characterized in that a property of the signal is that the signal is above a second threshold.

5. The receiver of claim 1, characterized in that the threshold involved is adapted to the output signal when tuned to the first frequency.

6. The receiver of claim 1, characterized in that the control means are arranged for repeating the sequence of tuning and testing n times, and in that the output signals are determined to be the same if in at least m out of n times the conditions involved are met.

7. The receiver of claim 6, characterized in that the control means are arranged for waiting a predetermined period between each sequence.

8. The receiver of claim 1, characterized in that the control means are arranged for executing a further sequence, substantially equal to the sequence, but differing in that the at least one property and similar properties in the sequence are different from the at least one property and the similar properties in the further sequence.

* * * * *